United States Patent [19]

Kurakado et al.

[11] Patent Number: 5,710,437
[45] Date of Patent: Jan. 20, 1998

[54] RADIATION DETECTING DEVICE USING SUPERCONDUCTING TUNNEL JUNCTION AND METHOD OF FABRICATING THE SAME

[75] Inventors: Masahiko Kurakado; Toru Takahashi, both of Kawasaki; Atsuki Matsumura, Sagamihara, all of Japan

[73] Assignee: Nippon Steel Corporation, Tokyo, Japan

[21] Appl. No.: 204,563

[22] Filed: Mar. 2, 1994

[30] Foreign Application Priority Data

| Mar. 5, 1993 | [JP] | Japan | 5-070816 |
| Mar. 24, 1993 | [JP] | Japan | 5-065158 |
| Mar. 26, 1993 | [JP] | Japan | 5-068180 |
| Dec. 28, 1993 | [JP] | Japan | 5-349627 |

[51] Int. Cl.$^6$ .......... H01L 29/41; H01L 29/88; H01L 31/06; H01L 31/102
[52] U.S. Cl. .......... 257/32; 257/31; 257/36; 250/336.2; 505/817; 505/874
[58] Field of Search .......... 257/31, 32, 36; 250/336.2; 505/817, 874

[56] References Cited

U.S. PATENT DOCUMENTS

| 3,852,795 | 12/1974 | Ames | 257/36 |
| 4,660,061 | 4/1987 | Sweeney | 257/32 |

FOREIGN PATENT DOCUMENTS

| 0 375 465 | 6/1990 | European Pat. Off. |  |
| 0 449 559 | 10/1991 | European Pat. Off. |  |
| 0468868 | 1/1992 | European Pat. Off. | 257/31 |
| 0 477 495 | 4/1992 | European Pat. Off. |  |
| 4-288885 | 10/1992 | Japan | 257/31 |
| 5-90652 | 4/1993 | Japan | 257/31 |
| 5-167123 | 7/1993 | Japan | 257/31 |
| 5315659 | 11/1993 | Japan . |  |

OTHER PUBLICATIONS

Twerenbold et al., "Superconducting Sn/Sn-oxide/Sn Tunneling Junctions as High-Resolution X-ray Detector", Journal of Applied Physics, vol. 61, No. 1, Jan. 1, 1987, pp. 1-7.

Appl. Phys. Lett. USA, Applied Physics Letters, 11 Nov. 1991, 59, 20, 2609-2611 ISNN 0003-6951, Ketchen M B et al. "Sub-mu m, planarized, Nb-A10/sub x/-Nb Josephson process for 125 m wafers developed in partnership with Si technology".

"Nb/A1-A10x/Nb Superconductor Detector with Single Crystal Nb Bottom Layer", M. Kurakado et al., The Institute of Electronics, Information and Communication Engineers in Japan, SCE 90 19, Jul. 25, 1990, pp. 7-12.

"Developments in Superconducting Tunnel Junction Detectors", M. Kurakado, Nuclear Instruments and Methods in Physics Research A314 (1992) pp. 252-262.

"X-ray Detector with Nb/A10x/Nb Superconductor Detectors", M. Kurakado et al., Japanese Journal of Applied Physics, vol. 28, No. 3, Mar. 1989, pp. L459-L461.

Study of Nb/A10x/Nb Superconductor Detectors with X-ray and Pulse Light, M. Kurakado et al., Sensors and Actuators, A21-A23 (1990) pp. 33-36.

Feautrier et al., "Low Noise 80-115 GHz Quasiparticle Mixer With Small Nb/A1-Oxide/Nb Tunnel Junctions", International Journal of Infrared and Millimeter Waves, vol. 11, No. 2, 1990, pp. 189-200.

Imamura et al., "Effects Of Intrinsic Stress On Submicrometer Nb/A1O$_x$/Nb Josephson Junctions", Transactions on Magnetics, vol. 25, No. 2, Mar. 1989, pp. 1119-1122.

Primary Examiner—Jerome Jackson
Attorney, Agent, or Firm—Pollock, Vande Sande & Priddy

[57] ABSTRACT

A radiation detecting device including a superconducting tunnel junction having a three-layer structure formed by depositing a lower electrode, a tunnel barrier layer, and an upper electrode in sequence. The upper electrode, the tunnel barrier layer and lower electrode have substantially aligned side walls around substantially their entire perimeters such that a cross-section of the three-layer structure along a path perpendicular to a direction of the deposition is substantially constant in shape and size along the direction of the deposition and such that no portion of the lower electrode or the upper electrode extends beyond the tunnel barrier layer. At least one of the upper electrode and the lower electrode is made of superconducting material.

11 Claims, 9 Drawing Sheets

RADIATION DETECTING DEVICE USING SUPERCONDUCTING TUNNEL JUNCTION AND METHOD OF FABRICATING THE SAME

BACKGROUND OF THE INVENTION

1. Field of the Invention

The present invention relates to a radiation detecting device using a superconducting tunnel junction and a method of fabricating the same.

2. Description of the Related Art

Radiation detectors using a superconducting tunnel junction Nb/Al-AlOx/Nb are known, as disclosed, for example, in the following documents:

a) "Nb/Al-AlOx/Nb Superconductor Detector with Single Crystal Nb Bottom Layer" by M. Kurakado et al, The Institute of Electronics, Information and Communication Engineers in Japan, SCE 90-19, Jul. 25, 1990.

b) "Developments in superconducting tunnel Junction detectors" by M. Kurakado, Nuclear Instruments and Methods in Physics Research A314 (1992) pp 252–262.

c) "X-ray Detector with Nb/AlOx/Nb Superconductor Detectors" by M. Kurakado et al, Japanese Journal of Applied Physics, Vol. 28, No. 3, March, 1989, pp L459–L461.

d) "Study of Nb/AlOx/Nb Superconductor Detectors with X-ray and Pulse Light" by M. Kurakado et al, Sensors and Actuators, A21–A23 (1990) pp 33–36.

In conventional radiation detectors using a superconducting tunnel junction such as a Nb/Al-AlOx/Nb junction or a (Nb/Ta)/Al-AlOx/Nb junction, electrons excited on the energy gap or holes in a superconducting electrode by radiation are passed through a tunnel barrier by the tunnel effect, resulting in signal charge. Herein, holes and electrons are referred to collectively as excited electrons for brevity. In fabricating a conventional radiation detector using a superconducting tunnel junction, lower wiring is formed by simultaneously patterning the same layer as that of a lower electrode. Hence, the lower wiring has the same thickness as the lower electrode. As shown in FIG. 1B, therefore, electrons excited by radiation in the vicinity of lower wiring 2 of a lower electrode 1 are readily diffused to the lower wiring 2. The probability of electrons passing through a tunnel barrier 3 and becoming signal charge is thus lowered. Furthermore, after the lower electrode 1 has been patterned, an upper electrode 4 is patterned. In general, therefore, the area of the lower electrode 1 or the upper electrode 4 is larger than the area of the tunnel barrier 3 disposed between them, as shown in FIGS. 1A, 1B and 2. Furthermore, the size of the lower electrode does not completely coincide with the size of the upper electrode, causing a slight discrepancy. Depending upon the relative relations among sizes of the upper electrode, the lower electrode, and the lower wiring, electrons excited by radiation incident upon the vicinity of the junction diffuse to an area outside of a junction area included in the lower or upper electrode, or to wiring connected to the lower or upper electrode. Thus, the signal charge becomes small. As a result, the magnitude of signal generated by radiation having the same intensity varies, depending on positions of incidence. This involves a problem of lowered precision of detection and, hence, lowered energy resolution.

Furthermore, in radiation detecting devices, the time required for excited electrons to pass through the tunnel barrier depends upon the thickness of the electrode and the mean free path of excited electrons in the electrode. If the time required for passing through the tunnel barrier becomes longer, the recombination probability of excited electrons increases and the signal charge decreases. Since X rays and γ rays have high transmissivity, signals are generated from both electrodes. From a plurality of X rays having the same energy level, for example, two signals of different magnitudes are generated.

In detecting X rays, X rays having various energy levels are, in general, measured simultaneously. If two signals different in magnitude are generated, the energy intensity does not definitely correspond to the signal magnitude so that measurement of energy distribution of X rays is thus difficult. For solving this problem, it is desired to make the magnitude of the signal generated from the upper electrode equal to the magnitude of the signal generated from the lower electrode. However, energy resolution, as required of the superconductor detecting device, is a high resolution, as high as 1% or less. Since the magnitude of the signal, that is, the quantity of signal charge generated from each electrode, depends upon the material and layer thickness of each electrode and the mean free path of excited electrons therein, it is extremely difficult to fabricate such a device that signals generated from both electrodes by X rays of the same energy level become always equal in magnitude.

Furthermore, in detecting X rays in a radiation detecting device using a superconducting tunnel junction, phonons having high energy may be generated in a substrate by radiation absorbed in the substrate. As a result of absorption of the phonons in the superconducting tunnel junction, so-called false signals smaller than the signals generated by radiation absorbed directly in the junction may be generated. The magnitude of the false signals generated by the phonons depends upon the position where radiation is absorbed in the substrate. Since the substrate is far larger in size than the tunnel junction, the number of false signals is far larger than the number of true signals generated by radiation directly absorbed into the junction. In measuring a mixture of radiation having high low energy, therefore, the peak of pulse height spectrum caused by radiation having low energy directly absorbed in the junction is concealed by the continuous pulse height spectrum caused by phonons generated by radiation having high energy. Thus, measurement of low-energy radiation is made difficult.

The problem of a difference in size between the upper electrode and the lower electrode will now be discussed further. In fabrication of the conventional radiation detecting device shown in FIGS. 1A and 1B, a three-layer film including a lower electrode layer, a tunnel barrier layer, and an upper electrode layer is first formed on the whole surface of a substrate 11 in general. Then this three-layer film is etched to form a pattern of the three-layer film corresponding to the lower electrode 1 and the lower wiring 2. Subsequently, by using a resist mask corresponding to the upper electrode 4 having an area smaller than that of the lower electrode 1, the three-layer film is etched so as to retain a portion expected to become the upper electrode 4. The radiation detecting device as shown in FIGS. 1A and 1B is thus formed. In the case of this structure, it is not easy to make the area of the upper electrode 4 nearly equal to the area of the lower electrode 1. For example, it is not easy to make the difference between the length of one side of the upper electrode and the length of one side of the lower electrode less than 2 μm. One of the reasons is that it is difficult to align the mask of the photoresist to be used in etching for patterning the upper electrode with the lower electrode at an accuracy of at least the above described value.

A further essential reason that alignment is difficult occurs when the difference between the length of one side of the upper electrode and the length of one side of the lower electrode is made shorter than 2 μm. In this case, there is a possibility that an Al-AlOx layer in a peripheral part 23 of a tunnel barrier layer 3 may be dissolved by a developing solution 24 for developing a mask 21 of a photoresist to be used in patterning the upper electrode as shown in FIGS. 3A and 3B. If a short circuit is caused between the upper electrode and the lower electrode in the dissolved portion, it causes the junction to have a large leakage current so that it is not applicable to a detector. Therefore, it is usual to make the length of one side of the lower electrode larger than the length of one side of the upper electrode by a value exceeding 2 μm so that the tunnel barrier layer may not be dissolved by the etching process for patterning the upper electrode.

According to a method shown in FIGS. 4A and 4B, a three-layer film including a lower electrode layer, a tunnel barrier layer, and an upper electrode layer is formed on the whole surface of a substrate 11. Subsequently, an upper electrode 4 is formed by etching only the upper electrode layer so as to retain the tunnel barrier layer 3 and the lower electrode layer 7 of the three-layer film. Subsequently, a mask of a photoresist 21 is formed in a pattern of lower electrode and lower wiring. The lower electrode 1 and the lower wiring are then formed. In this method as well, however, there is a possibility that a peripheral part 23 of the junction in the tunnel barrier layer may be dissolved by a developing solution for developing a mask of a photoresist 21. For making a junction having a small leakage current, therefore, the length of one side of the upper electrode must be made sufficiently smaller than the length of one side of the lower electrode.

The inventors have proposed, in JP-A-5-315659 published on Nov. 26, 1993, to make, as shown in FIG. 5, the lower wiring 2 thinner than the lower electrode 1 by etching, when forming a junction device from a three-layer film including the lower electrode layer, tunnel barrier layer, and upper electrode layer; to make the three-layer film in a pattern of the lower electrode 1 and the lower wiring 2; and thereafter, when patterning of the upper electrode, to etch the three-layer film to a middle of thickness of the lower electrode. In this case, however, the thickness of the lower wiring is controlled only by etching time or the like. In addition, the etching speed is not always constant over the whole surface of the substrate. Therefore, it is difficult to make the thickness of the lower wiring not larger than a fraction of the thickness of the lower electrode with high reproducibility. In addition, the area of the lower electrode 1 is larger than the area of the upper electrode 4 in this structure as understood from FIG. 5. In this case as well, therefore, excited electrons are diffused to outside of the junction area in the lower electrode, resulting in a problem that signal charges become small.

SUMMARY OF THE INVENTION

A first object of the present invention is to provide a radiation detecting device which generates, a signal having a magnitude definitely determined substantially by the energy level of the radiation, and to provide a method of fabricating such a radiation detecting device.

A second object of the present invention is to provide a radiation detecting device using a superconducting tunnel junction and a method of fabricating the same. The superconducting tunnel junction makes it possible to prevent reduction of signal charge, lowering of detection precision, or lowering of energy resolution caused by diffusion of excited electrons to an outside portion of the junction area of the lower electrode or the upper electrode or to the lower wiring, because the area of the lower electrode or the upper electrode is different from the area of the tunnel barrier layer located between them or the lower wiring has the same thickness as the lower electrode.

In order to achieve the above described first object, a radiation detecting device using a superconducting tunnel junction according to the present invention includes an upper electrode; a tunnel barrier layer; a lower electrode; and a superconducting tunnel junction having a three-layer structure formed by depositing the upper electrode, the tunnel barrier layer, and the lower electrode in sequence. A cross-sectional area of the three-layer structure in a direction perpendicular to a direction of the deposition is substantially constant along the deposition direction.

In order to achieve the first object of the present invention, a radiation detecting device using a superconducting tunnel junction according to one aspect of the present invention includes a substrate; a superconducting tunnel junction having a three-layer structure formed by depositing, an upper electrode, a tunnel barrier layer, and a lower electrode; and an excited electron absorption layer. The absorption layer is made of one of a superconducting material having an energy gap smaller than that of a superconducting material forming at least one of the upper electrode and the lower electrode, a normal conducting metal having no energy gap, or a semi-metal. The excited electron absorption layer is formed at a position in one of the upper electrode and the lower electrode and isolated from the tunnel barrier layer.

In order to achieve the first object of the present invention, a radiation detecting device using a superconducting tunnel junction according to another aspect of the present invention includes a substrate; a superconducting tunnel junction having a three-layer structure formed by depositing, an upper electrode, a tunnel barrier layer, and a lower electrode; and a phonon absorption layer. The absorption layer is made of one of a superconducting material having an energy gap smaller than that of a superconducting material forming at least one of the upper electrode and the lower electrode or a normal conducting metal having no energy gap wherein the phonon absorption layer is formed between the substrate and the junction.

A method of fabricating a radiation detecting device using a superconducting tunnel junction according to one aspect of the present invention includes the steps of: forming a three-layer lamination by depositing, on a substrate in sequence, a first layer, a second layer forming a tunnel barrier layer, and a third layer. The three-layer lamination is etched to form a three-layer intermediate structure having a pattern corresponding to a portion including the tunnel junction and lower wiring. The three-layer intermediate structure is etched so as to retain its portions corresponding to a part including the junction and a part of the lower wiring contiguous to the junction and at least a part of the first layer providing the lower wiring and to remove remaining portions thereof.

A method of fabricating a radiation detecting device using a superconducting tunnel junction according to another aspect of the present invention includes the steps of: forming a three-layer lamination by depositing, on a substrate in sequence, a first layer, a second layer forming a tunnel barrier layer, and a third layer. The third layer of the three-layer lamination is selectively etched to form a three-layer intermediate structure having the first layer, the second layer, and a patterned third layer having a selected pattern larger than the junction of the radiation detecting device. The three-layer intermediate structure is etched so as to retain its portions corresponding to the junction and the lower wiring and to remove its other portions.

DESCRIPTION OF THE PREFERRED EMBODIMENTS

A first embodiment of the present invention will now be described by referring to FIGS. 6A, 6B, 7A and 7B.

Figure 6A:
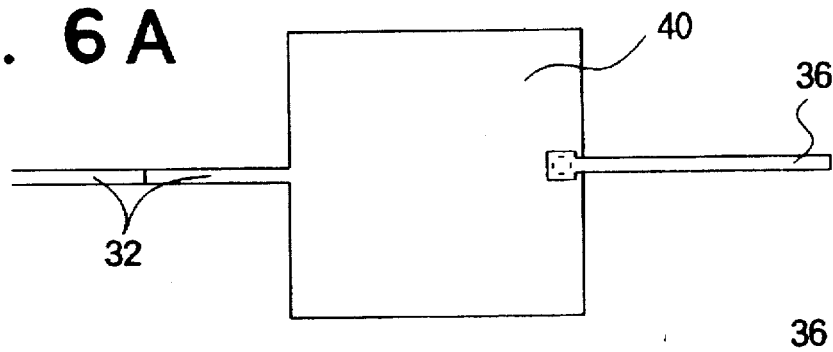
FIGS. 6A and 6B are, respectively, a top view and a sectional view showing the structure of a first embodiment of a radiation detecting device according to the present invention.
Figure 6B:
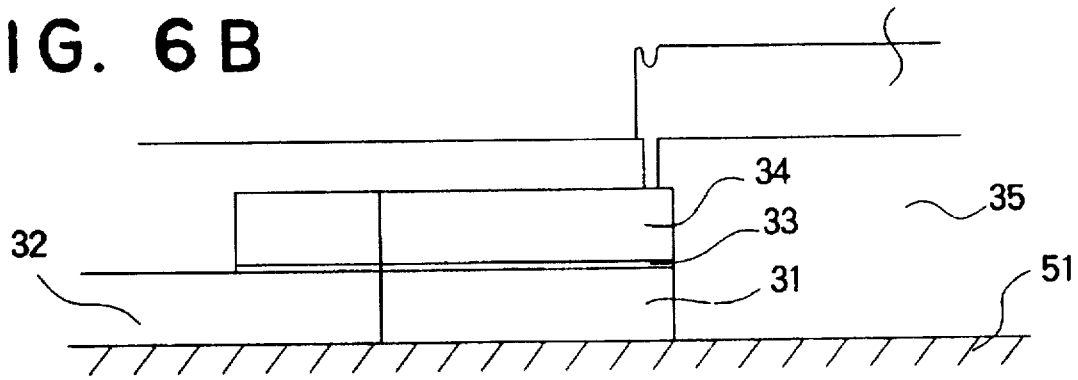
Figure 7A:
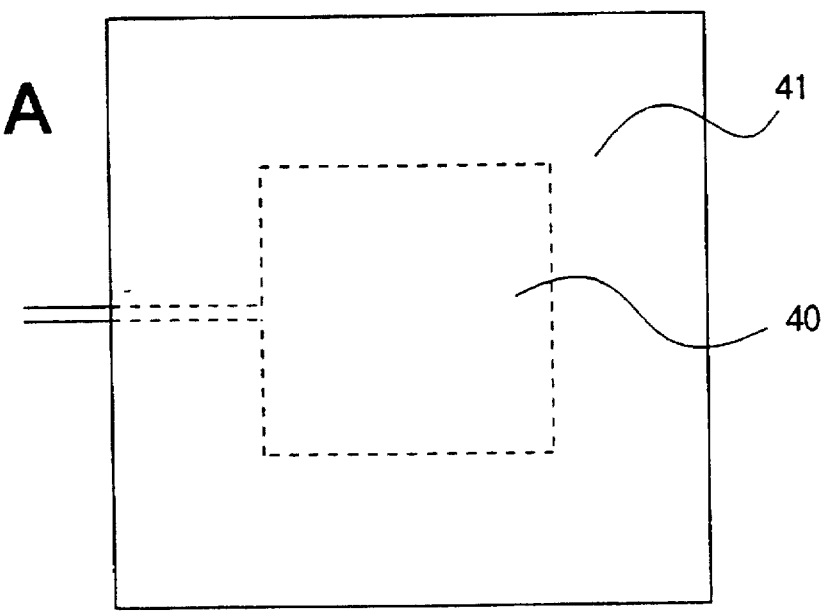
FIGS. 7A and 7B are diagrams for explaining an example of a method of fabricating the radiation detecting device shown in FIGS. 6A and 6B.
Figure 7B:
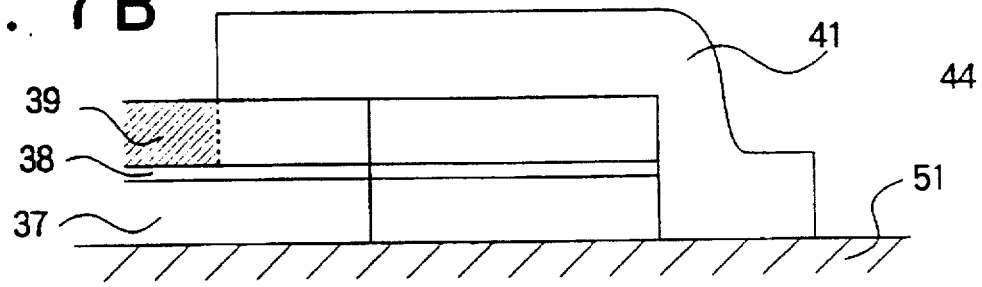

An example (embodiment 1A) of a method of fabricating the first embodiment shown in FIGS. 6A and 6B will now be described with reference to FIGS. 7A and 7B. First of all, on a sapphire substrate 51, a film 37 of a superconducting material Nb, an Al-AlOx film 38 serving as a tunnel barrier layer, and a film 39 of a superconducting material Nb are successively deposited to form a three-layer lamination. Both the Nb films 37 and 39 have thickness of 400 nm. The Al-AlOx film 38 is made by oxidizing the surface of an Al film having a thickness of 17.5 nm to form a surface layer of AlOx. The three-layer lamination is subjected to reactive ion etching (RIE) by using a mask formed of photoresist so as to retain its portion corresponding to a junction having an area of 100×100 μm2 and a portion to be used as lower wiring having a width of 5 μm, and to remove its remaining portions. Thereby, a junction of a lower electrode 31 of a Nb film, a tunnel barrier layer 33 of an Al-AlOx film, and an upper electrode 34 of a Nb film is formed as shown in FIGS. 6A and 6B. Thereafter, a photoresist 41 is formed in an area of 200×200 μm2 around an area 40 providing the junction as shown in FIGS. 7A and 7B. By using the photoresist as a mask, the Nb film 39 of a portion outside of the mask for forming the lower wiring is removed by reactive ion etching so that the lower wiring 32 of the Nb film 37 and the Al-AlOx film 38 is thus formed. When the photoresist film 41 is developed in this case, the tunnel barrier film 38 of the junction is not dissolved because the peripheral part of the junction is covered by resist. Thereafter, an interlayer insulation layer 35 of $SiO_2$ and upper wiring 36 of Nb are formed. Thus, a radiation detecting device having an area of 100×100 $\mu m^2$ as shown in FIGS. 6A and 6B is obtained.

In the above described embodiment, a portion of the lower wiring in the range of 50 μm from the connection to the junction 40 has a three-layer structure, that is, upper electrode layer—tunnel barrier layer—lower electrode layer. Therefore, excited electrons diffused to the lower wiring can act as a signal charge by the tunnel effect, thereby preventing a lowering of signal charge. Therefore, the length of the portion of the lower wiring having the three-layer structure is made equal to or longer than 10 μm. Furthermore, in order to cause the excited electrons to be hardly diffused from the upper electrode to upper wiring, it is desired that the area of the connection portion between the upper wiring and the upper electrode is as small as approximately 10×10 $\mu m^2$.

Furthermore, in the above described embodiment, the Nb film 39 is etched in order to form the lower wiring. However, the Nb film 39, Al-AlOx film 38, and a part of Nb film 37 may be etched instead.

Another example (embodiment 1B) of a method of fabricating the first embodiment shown in FIGS. 6A and 6B will now be described by referring to FIGS. 8A and 8B.

Figure 8A:
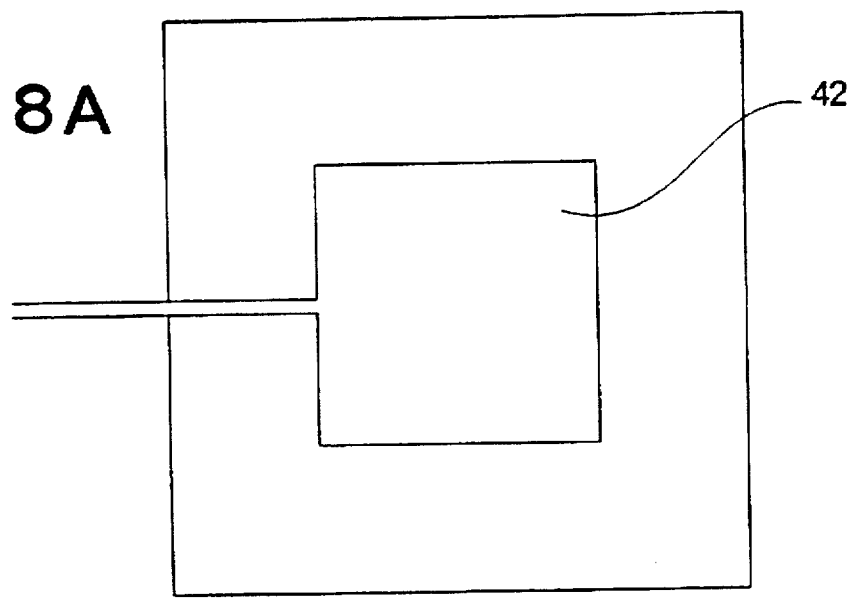
FIGS. 8A and 8B are diagrams for explaining another example of the method of fabricating the radiation detecting device shown in FIGS. 6A and 6B.
Figure 8B:
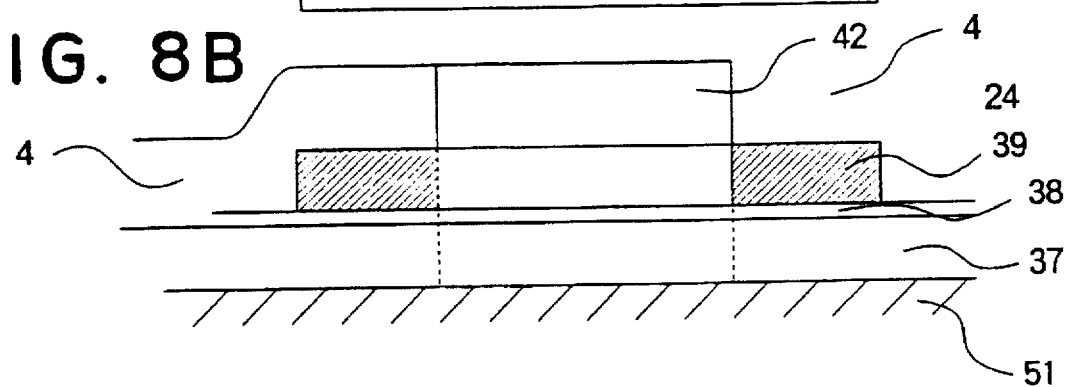

According to this embodiment, in the reactive ion etching (RIE) of the three-layer lamination including the film 37 of the superconducting material Nb, the Al-AlOx film 38 serving as the tunnel barrier layer, and the film 39 of the superconducting material Nb, only an area of 200×200 $\mu m^2$ of the upper Nb layer 39 located around an area in which the junction should be formed is retained and remaining portions of the upper Nb layer 39 are removed, so that a three-layer intermediate structure as shown in FIG. 8A is thus formed. By using a photoresist mask 42, portions of the three layers other than a portion of the three-layer intermediate structure for providing the junction and lower wiring having a width of 5 μm are then removed by reactive ion etching (RIE) to form the junction and lower wiring. When the photoresist film 42 is developed in this case, the tunnel barrier film 38 of the junction is not dissolved by a liquid developer because the peripheral part of the junction is not exposed yet. Thereafter, an interlayer insulation layer 35 of $SiO_2$ and upper wiring 36 of Nb are formed. Thus, a radiation detecting device having an area of $100\times100$ $\mu m^2$ as shown in FIGS. 6A and 6B is obtained.

Figure 1A:
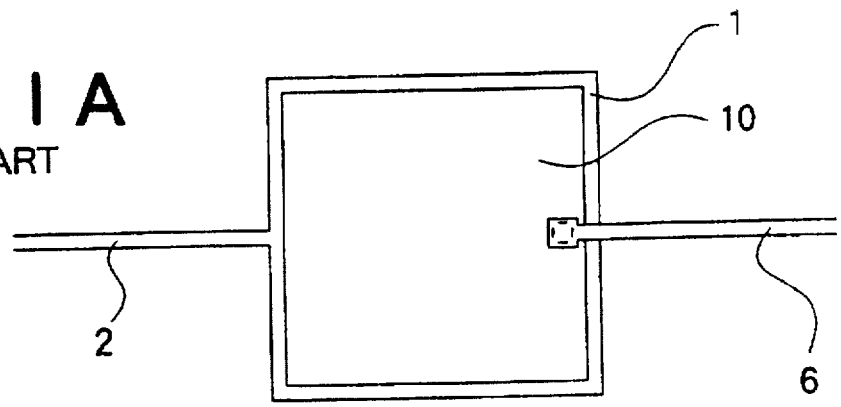
FIGS. 1A and 1B are, respectively, a top view and a sectional view showing the structure of an example of a conventional radiation detecting device.
Figure 1B:
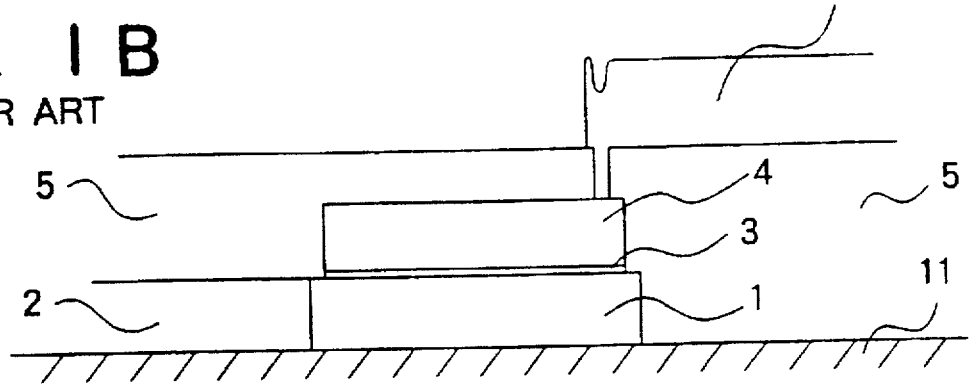
Figure 2:
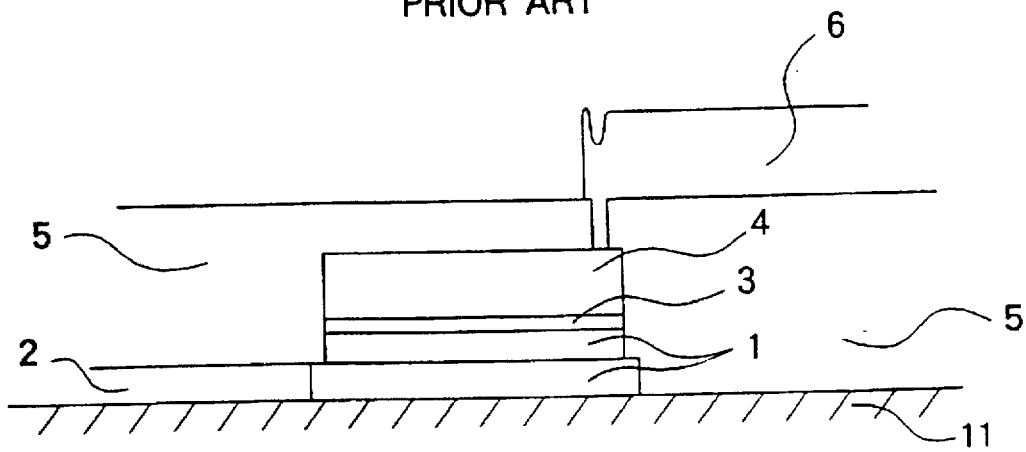
FIG. 2 is a sectional view showing the structure of another example of a conventional radiation detecting device.
Figure 3A:
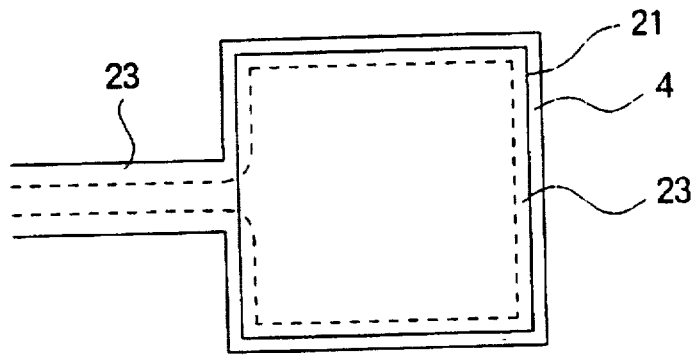
FIGS. 3A and 3B are, respectively, a top view and a sectional view showing an example of a conventional radiation detecting device in which a tunnel barrier layer has been melted by a liquid developer.
Figure 3B:
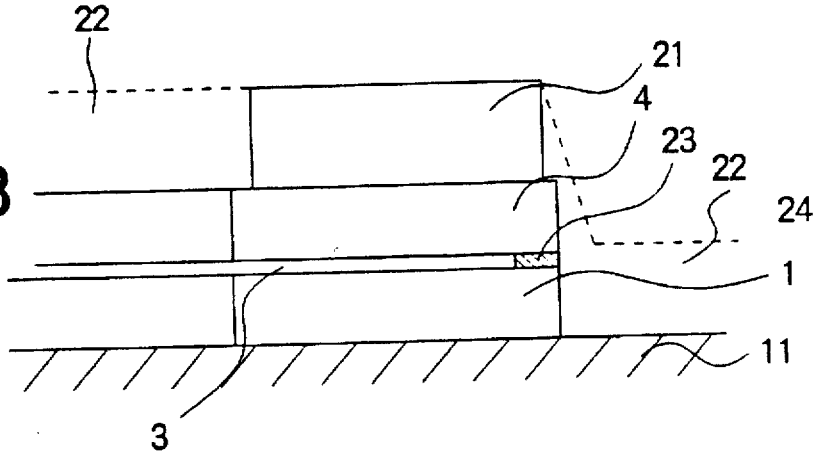
Figure 4A:
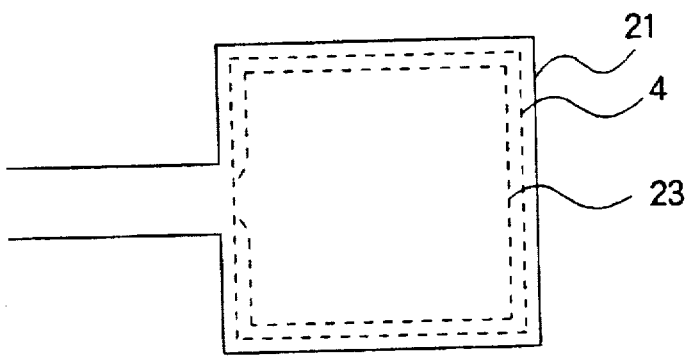
FIGS. 4A and 4B are, respectively, a top view and a sectional view showing another example of a conventional radiation detecting device in which a tunnel barrier layer has been melted by a liquid developer.
Figure 4B:
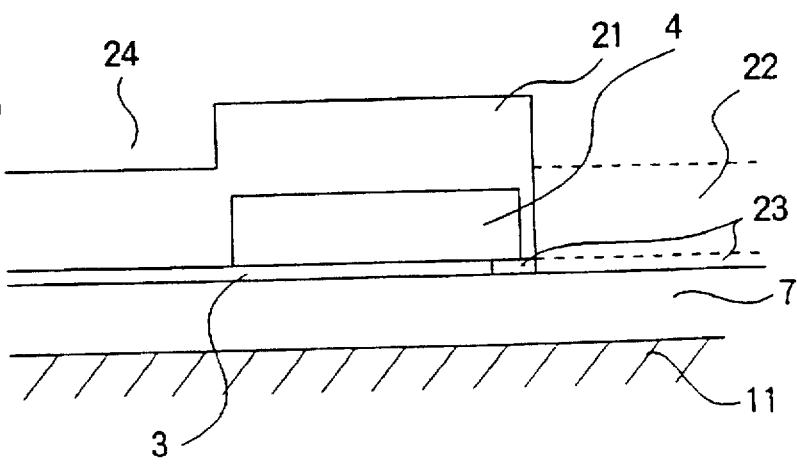
Figure 5:
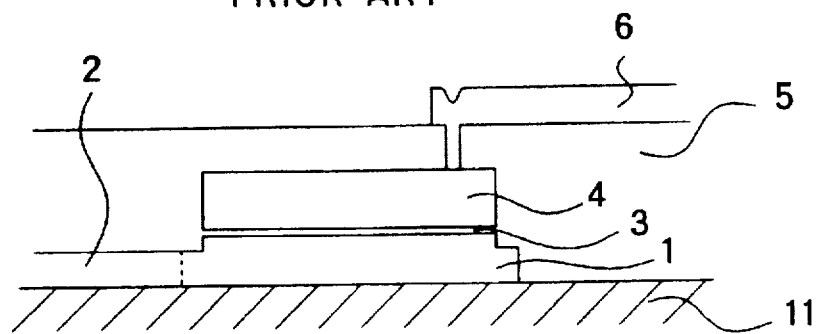
FIG. 5 is a sectional view of a radiation detecting device in which lower wiring has a cross-sectional area smaller than that of a lower electrode.

By using a radiation detecting device A according to the embodiment 1A, a radiation detecting device B according to the embodiment 1B, and conventional radiation detecting devices C and D shown in FIGS. 1A and 1B (where the device C has an area of $105\times105$ $\mu m^2$ of lower electrode and the device D has an area of $110\times110$ $\mu m^2$ of lower electrode), X rays from $^{55}Fe$ were detected. In all of these devices, the area of the upper electrode, that is, the area of the junction is $100\times100$ $\mu m^2$.

In the devices A and B of the embodiments of the present invention, no peripheral part of the lower electrode extends outside the upper electrode. In addition, even if electrons excited in the junction diffuse to the lower wiring, the electrons can act as signal charge efficiently by the tunnel effect therein. Therefore, the energy resolution is improved by approximately 20% as compared with the conventional device C, and the energy resolution is improved by approximately 40% as compared with the conventional device D.

Furthermore, in these devices A and B, sensitivity to light is improved by approximately 10% as compared with the conventional device C, and by approximately 20% as compared with the conventional device D.

In addition, in the devices A and B, allowance of error in alignment between two masks may be as large as 20 $\mu m$. Therefore, these devices can be fabricated easily by using a contact aligner.

As evident from these results, undesired influence of diffusion of excited electrons in the electrode upon the energy resolution can be significantly reduced, so long as the cross-sectional area of the junction formed by a three-layer lamination including a lower electrode, a tunnel barrier layer, and an upper electrode in a direction perpendicular to the direction of lamination, that is, the direction of thickness is substantially constant along the direction of thickness, even if the lower wiring and the lower electrode of the superconducting tunnel junction radiation detecting device are formed from the same film.

In the above described embodiment, the lower electrode in the junction has no area which is separated from the tunnel barrier. The electrons excited in any position of the lower electrode by radiation or light can serve as signal charge efficiently. Therefore, the sensitivity is improved. In addition, the energy resolution is also improved because a change in signal magnitude depending on incidence position of radiation is reduced. As a result, measurement precision of radiation energy and light intensity is improved.

As shown in the above described embodiment, the Nb/Al-AlOx/Nb junction can be fabricated while protecting the tunnel barrier from the liquid developer, which otherwise dissolves readily the Al-AlOx tunnel barrier.

In the same way, it is evident that the present invention can also be applied to a Ta/Al-AlOx/Ta junction containing Ta which is similar to Nb in chemical property.

Furthermore, also in case of Sn/SnOx/Sn, Al/AlOx/Al, Nb/NbOx/Nb, or Ta/TaOx/Ta junction in which the tunnel barrier is not dissolved more easily than the electrode by the liquid developer, it suffices according to the present invention to remove a part of the layer providing the upper electrode located on the lower wiring at a place away from the junction. Therefore, it is possible to solve the problem of the conventional device that diffusion of excited electrons reduces signal charge or affects the energy resolution because the area of the lower electrode or the upper electrode is different from the area of the tunnel barrier layer located between them and excited electrons diffused to the lower wiring cannot act signal charge because of the tunnel effect.

It has heretofore been assumed that there exist the lower electrode layer, tunnel barrier layer, and upper electrode layer over a length of at least 10 $\mu m$ of the lower wiring from its connection to the junction or a place close to the junction. A length less than 10 $\mu m$ increases the probability that excited electrons diffused from the junction to the lower wiring will diffuse further outside before they act signal charge because of the tunnel effect.

A second embodiment of the present invention will now be described.

According to this embodiment, in a radiation detecting device including a superconducting tunnel junction in which at least a lower electrode is a superconductor, a conductive film thinner than the lower electrode of the superconducting tunnel junction to be fabricated and an etching stopper film are first formed on a substrate. Lower wiring is formed by using the thin conductive film so that the etching stopper film remains on the surface of at least a portion of the thin conductive film which is not covered by the lower electrode of the junction which is formed later. In this embodiment, the etching stopper film is a film serving as an etching stopper when the lower electrode of the junction is etched. Thereafter, the lower electrode layer, the tunnel barrier layer, and the upper electrode layer are deposited on the whole surface of the substrate. The three-layer film is etched so as to retain its portion which provides the junction. Thus, the lower wiring and the junction are formed separately.

As the conductive film used for the lower wiring, a normal conducting metal, a semiconductor, or a superconductor may also be used. For preventing excited electrons from diffusing from the lower electrode to the lower wiring, it is more desirable to use as material of the lower wiring a superconductor having an energy gap larger than that of the lower superconductor of the junction.

Furthermore, it is desirable to use a superconducting tunnel junction having an area of the lower electrode equivalent to that of the upper electrode so that electrons excited near the peripheral part of the junction may also act signal charge efficiently.

In the second embodiment, the lower wiring is thinner than the lower superconductor electrode of the junction, and hence lowering of the energy resolution and sensitivity caused by diffusion of excited electrons from the lower electrode to the lower wiring can be reduced.

Furthermore, in the second embodiment, the lower wiring and the lower electrode are formed separately. Therefore, there may be a difference in material between the lower wiring and the lower electrode. By using, for the lower wiring, a superconductor having an energy gap larger than that of a superconductor of the lower electrode, it is also possible to prevent excited electrons from diffusing from the lower electrode to the lower wiring.

Furthermore, since the lower wiring is formed separately from the junction, it is also possible to form the lower electrode and the upper electrode of the junction simultaneously by one etching process so that the area of the lower electrode is made equal to that of the upper electrode. In this case, there is no radiation impinged on a vicinity of non-overlapping portion of the lower electrode and the upper electrode.

Furthermore, when a film of a superconductor having a small energy gap or a normal conductor is formed to overlap with the wiring at its portion which is separated from the junction electrode, electrons excited by radiation in wiring are trapped by the overlapped conductor. Thus, it is also possible to substantially prevent superfluous signals due to those electrons from being generated from the junction.

An example (embodiment 2A) of the second embodiment will now be described by referring to FIGS. 9A and 9B.

Figure 9A:
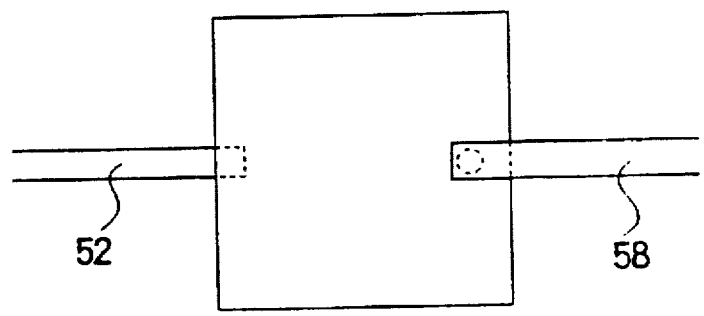
FIGS. 9A and 9B are, respectively, a top view and a sectional view showing the structure of a second embodiment of a radiation detecting device according to the present invention.
Figure 9B:
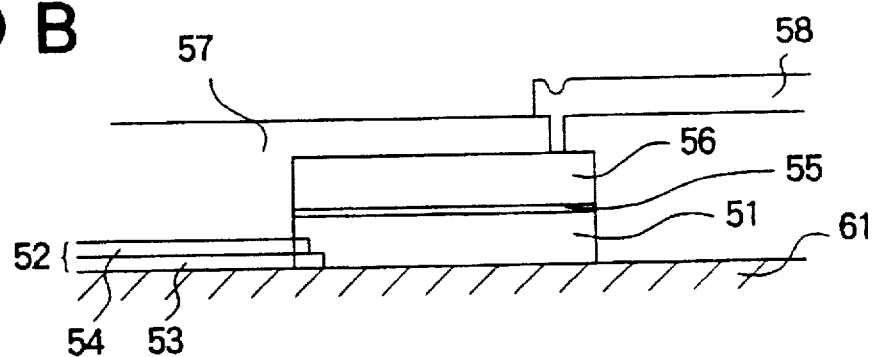

In this embodiment, a two-layer film including a niobium (Nb) film 53 having a thickness of 100 nm and an aluminum oxide film 54 having a thickness of 20 nm is formed on a sapphire substrate 61 as shown in FIGS. 9A and 9B. By using lithography and reactive ion etching, lower wiring 52 having a width of 5 μm is then formed from the two-layer film. Thereafter, aluminum oxide of 5 μm of wiring tip on the junction side is removed by lithography and wet etching process using phosphoric acid. The aluminum oxide film 54 functions as an etching stopper at the etching for forming the junction.

On the whole surface of the substrate having this lower wiring thus formed, a three-layer film of Nb/Al-AlOx/Nb is formed by sputtering. Each of two Nb layers has a thickness of 400 nm. The Al-AlOx film is obtained by oxidizing the surface of Al having a thickness of 15 nm to form an AlOx layer. The three-layer film is subjected to reactive ion etching using a mask formed by photoresist to retain its portion forming the junction and remove the other portions so that the upper and lower Nb electrodes 56 and 51, respectively, are made with equal areas. The junction is formed so that the lower electrode of the junction overlaps with the tip of the lower wiring 52 by 10 μm. By etching Nb of the lower electrode 51 under the condition that aluminum oxide is hardly etched, the lower wiring is retained without being etched.

Thereafter, a SiO$_2$ film 57 serving as an interlayer insulation layer and upper wiring 58 of Nb are formed to fabricate a junction device.

Figure 10:
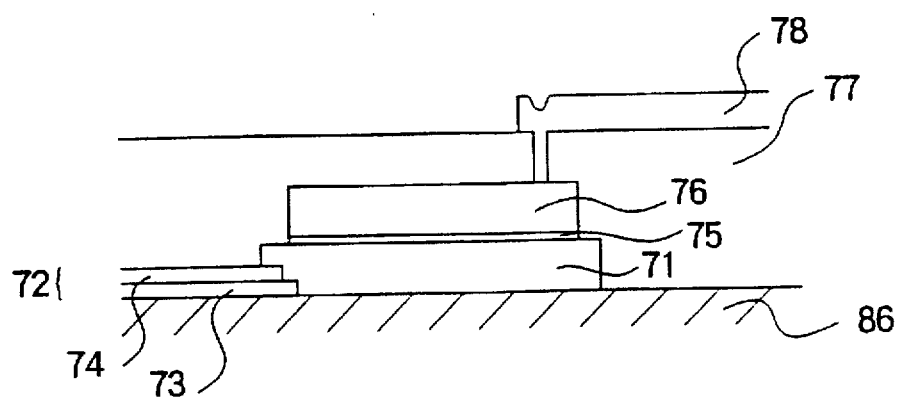
FIG. 10 is a sectional view showing a variant of the second embodiment of a radiation detecting device according to the present invention.

A variant (embodiment 2B) of the second embodiment will now be described by referring to FIG. 10. In the same way as the embodiment 2A, lower wiring 72 having a two-layer structure is formed. Thereafter a three-layer film of Nb/Al-AlOx/Nb is formed on the whole surface of a substrate. Then, the three-layer film is etched selectively by using a first mask to form a three-layer intermediate structure having a pattern corresponding to a lower electrode 71. Subsequently, the upper Nb layer and Al-AlOx layer of the intermediate structure are etched by using a second mask smaller in area than the first mask to form an upper electrode 76 and a tunnel barrier layer 75. Thereafter, a radiation detecting device is made by a process similar to the embodiment 2A. Except that the area of the upper electrode 76 is slightly smaller than that of the lower electrode 71, the embodiment 2B is the same as the embodiment 2A.

In another variant (embodiment 2C) of the second embodiment, the lower wiring is formed from a two-layer film including a niobium nitride film having a thickness of 100 nm and an energy gap larger than that of Nb and an aluminum oxide film having a thickness of 20 nm. Other conditions of fabrication are the same as those of the embodiment 2B.

Still another variation (embodiment 2D) of the second embodiment will now be described by referring to FIGS. 11A to 11E.

Figure 11A:
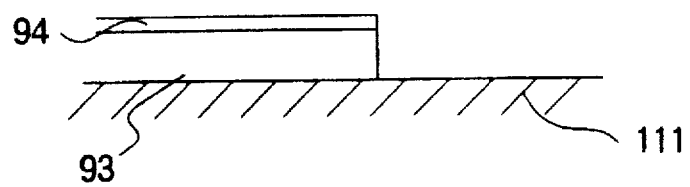
FIGS. 11A–11E are diagrams for explaining still another variant of the second embodiment of a radiation detecting device according to the present invention.
Figure 11B:
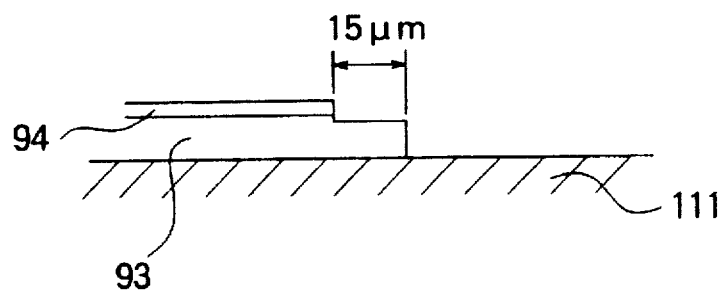
Figure 11C:
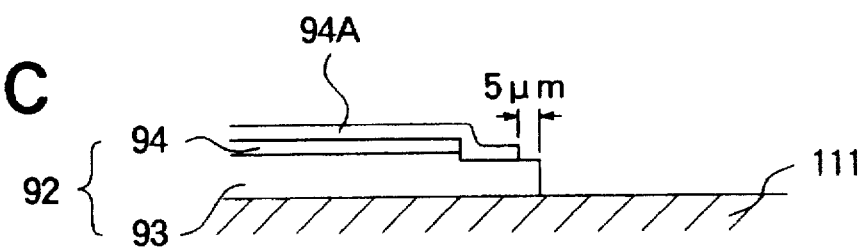
Figure 11D:
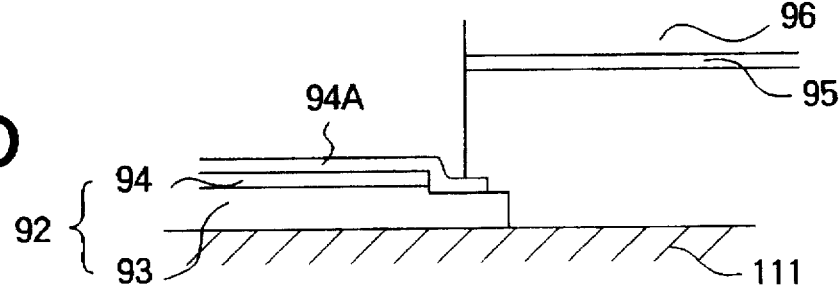
Figure 11E:
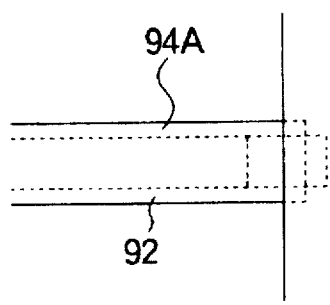

First, a lower wiring pattern is formed by a niobium nitride film 93 having a thickness of 100 nm and an aluminum film 94 having a thickness of 30 nm and having an energy gap smaller than that of the superconducting material of the lower electrode, as shown in FIG. 11A. A length of 15 μm of the tip of the aluminum film on the junction side is removed by etching, as shown in FIG. 11B. Thereafter, an etching stopper film having a thickness of 20 nm is further deposited to form a film 94A, as shown in FIG. 11C. The aluminum oxide film 94A is etched so that the aluminum oxide film 94A covers the lower wiring pattern 92 other than its tip of 5 μm. Thus, the lower wiring is fabricated, as shown in FIGS. 11D and 11E. The succeeding process is the same as that of the embodiment 2A.

By using respective devices of the embodiments 2A to 2D and the conventional device shown in FIG. 1B having a lower electrode thickness of 400 nm, a lower wiring thickness of 400 nm and a lower wiring width of 5 μm, X-rays from $^{55}$Fe were detected. In each of these devices, the area of the upper electrode, that is, the area of the junction was 100 Em×100 μm. In each of the conventional device and the devices of the embodiments 2B and 2C, the area of the lower electrode was 110 μm×110 μm.

In the device of the embodiment 2A, the leakage current increased by approximately 20% as compared with the conventional device. However, the energy resolution was improved by approximately 20% as compared with the conventional device, because not only diffusion of excited electrons to wiring was reduced but also no peripheral part of the lower electrode exceeds the upper electrode.

In the device of the embodiment 2B, the energy resolution was improved by approximately 10% as compared with the conventional device, because diffusion of excited electrons to wiring was reduced. The leakage current was equal to that of the conventional device.

In the device of the embodiment 2C, the influence of the diffusion of excited electrons to wiring was further reduced as compared with the device of the embodiment 2B. Hence, the energy resolution was improved by approximately 15% as compared with the conventional device.

In the device of the embodiment 2D, the influence of diffusion of excited electrons to wiring was further reduced as compared with the device of the embodiment 2A. Hence, the energy resolution was improved by approximately 25% as compared with the conventional device.

In these embodiments, Nb was used as the lower superconductor and aluminum oxide was used for the etching stopper film. However, it is evident that a combination of other materials may be used. For example, a combination of tantalum for the lower superconductor and magnesium oxide for the etching stopper may be used.

In the present embodiment, the lower wiring is formed independently of the lower electrode. Thereby, the thickness of the lower wiring can be made significantly thinner than that of the lower electrode. In addition, a material different from that of the lower electrode and capable of further suppressing diffusion of excited electrons to wiring can be used for the lower wiring. As a result, diffusion of excited electrons to wiring can be largely reduced. Furthermore, since the lower wiring is formed separately from the lower electrode, the area of the lower electrode of the junction can be made equal to that of the upper electrode. It then becomes easy to implement such a structure that a dead zone is not formed in the lower electrode. As a result, the accuracy in measurement of radiation energy and light intensity is improved.

A third embodiment of the present invention will now be described by referring to FIGS. 12 and 13.

Figure 12:
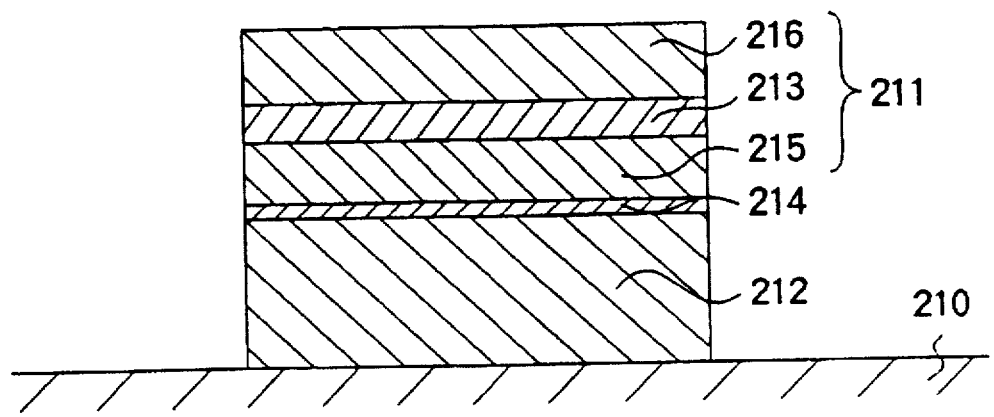
FIG. 12 is a sectional view showing the structure of a third embodiment of a radiation detecting device according to the present invention.

In a radiation detecting device of a superconducting tunnel junction having a structure of superconductor electrode / tunnel barrier / superconductor electrode according to the present embodiment, as shown in FIG. 12, an excited electron absorption layer 213 is formed in a position disposed within one of the superconductor electrodes and isolated from the tunnel barrier 214. The excited electron absorption layer is made of a superconductor having an energy gap smaller than the energy gap of either the superconductor 215 which constitutes the one superconductor electrode within which the excited electron absorption layer is formed or a superconductor of the other electrode different from the one electrode. Alternatively, the excited electron absorption layer is made of a normal conducting metal or semi-metal having no energy gap.

According to the present embodiment, an excited electron absorption layer 213 for absorbing electrons excited by radiation is formed in one of an upper electrode 211 and a lower electrode 212, as shown in FIG. 12. The excited electron absorption layer 213 is made of a superconductor having an energy gap $\Delta_{13}$ smaller than an energy gap $\Delta_{15}$ of a superconductor layer 215 located between the absorption layer and a tunnel barrier 214. Alternatively, the absorption layer 213 is made of a normal conducting metal or semi-metal having no energy gap.

Figure 13:
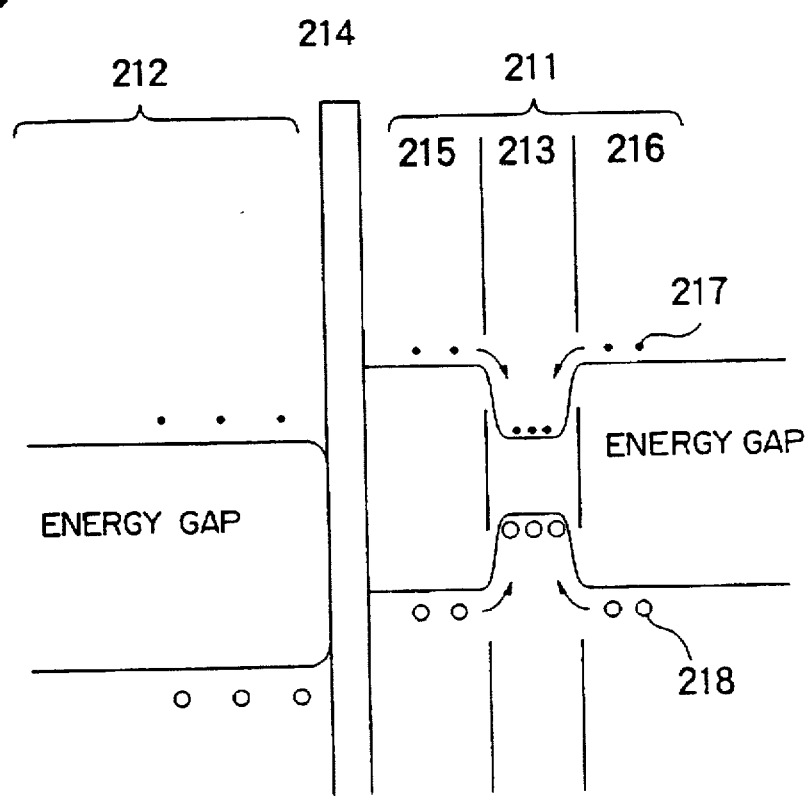
FIG. 13 is a diagram showing energy distribution of various parts obtained when voltage is applied between an upper electrode and a lower electrode of the radiation detecting device of FIG. 12.

In the device of the present embodiment as shown in FIG. 13, many of electrons 217 excited by radiation in the electrode 211 having the absorption layer 213 disposed therein and holes 218 generated by excitation of electrons are accumulated into the absorption layer 213 having a small energy gap. The ratio of electrons and holes transmitted through the tunnel barrier 214 by the tunnel effect to act as signal charge can thus be reduced significantly.

Excited electrons collected into the absorption layer 213 emit extra energy as phonons (recombination phonons), are recombined to form Cooper pairs, and relax under the energy gap. The energy of most of phonons emitted at that time is nearly $2\Delta_{13}$, Since this energy is smaller than $2\Delta_{15}$, which is the minimum energy required to destroy a Cooper pair in the superconductor layer 215 and excite two electrons, electrons cannot be excited there, above the energy gap. Among recombination phonons generated in the absorption layer 213 are part of the recombination phonons that have arrived at the tunnel barrier are transmitted through the tunnel barrier and impinged upon the other superconducting electrode 212. If energy gap $\Delta_{12}$ of the superconductor of the superconducting electrode 212 is smaller than $\Delta_{13}$, those phonons can excite electrons in the electrode 212 and generate small signals. If $\Delta_{12}$ is larger than $\Delta_{13}$, those recombination phonons do not generate electrons in the electrode 212 either. Therefore, it is desirable that $\Delta_{13}$ of the absorption layer is smaller than the energy gap $\Delta_{12}$ of the electrode 212 having no absorption layer.

By the way, those recombination phonons are eventually scattered to outside of the junction such as wiring and substrate.

The absorption layer in the present embodiment must be formed at a position separated from the tunnel barrier. If the absorption layer is formed so as to be in contact with the tunnel barrier, excited electrons accumulated in the absorption layer readily collide with the tunnel barrier, which is in contact with the absorption layer. As compared with the case where the absorption layer is not provided, the excited electrons accumulated in the absorption layer pass through the tunnel barrier more efficiently and act as signal charge.

An example (embodiment 3A) of fabrication of a radiation detecting device of the third embodiment will now be described.

On a sapphire substrate 210, Nb having a thickness of 200 nm is deposited as the lower electrode. Al having a thickness of 15 nm with its surface oxidized to form AlOx is deposited on Nb as the tunnel barrier. Thereon, Nb having a thickness of 50 nm and Ta having a thickness of 150 nm are deposited as the upper electrode. Thus, deposition is successively performed by using a sputtering device to form a three-layer film. The three-layer film is etched by using the lithography technique to fabricate a tunnel junction device.

In this embodiment, the tantalum (Ta) layer having energy gap of 1.4 meV serves as the excited electron absorption layer. The magnitude of superconducting energy gap of Al alone is as small as 0.34 meV. As is well known, however, the magnitude of energy gap of the thin Al of the Al-AlOx layer becomes close to that of Nb because of the proximity effect with respect to Nb, having an energy gap magnitude of 3 meV, located directly under Al.

Another example (embodiment 3B) of a fabrication method of the present embodiment will now be described.

On a sapphire substrate 210, Nb having a thickness of 200 nm is deposited as the lower electrode 212. Al having a thickness of 15 nm with its surface oxidized to form AlOx is deposited on Nb as the tunnel barrier 214. Thereon, Nb 215 having a thickness of 50 nm, Al 213 having a thickness of 60 nm, and Nb 216 having a thickness of 20 nm are deposited as the upper electrode. Thus, deposition is successively performed by using a sputtering device. A resultant three-layer film is etched by using the lithography technique to fabricate a tunnel junction device. In case of this device, the Al layer included in the upper electrode 211 serves as the excited electron absorption layer 213. This Al layer is as thick as 60 nm. In spite of the proximity effect with respect to the Nb layer, therefore, an area having a sufficiently small energy gap is secured in that layer and this area serves as the excited electron absorption layer. The uppermost Nb layer of 20 nm is provided to prevent the Al layer of 60 nm from being oxidized.

In these devices, X rays from radioisotope $^{55}$Fe containing 5.9 keV of 88% and 6.5 keV of 12% were detected. In pulse-height distribution of signals obtained in respective devices, only one pair of peaks corresponding to 5.9 keV and 6.5 keV were observed. Signals produced from the upper electrode having the excited electron absorption layer disposed therein were less than noise in magnitude, and they were, in magnitude, less than one tenth of the signals produced from the lower electrode.

In these embodiments, Ta and Al were used as materials of the excited electron absorption layer and Nb and Al having an energy gap increased in close vicinity to Nb were used as other superconductors. As the material of superconductors other than the absorption layer, Pb, Sn, Ta or an oxide superconductor may also be used. As the material of the excited electron absorption layer, a superconductor having an energy gap smaller than that of the superconductors other than the absorption layer, a normal conducting metal having no energy gap, such as Ag or Cu, or a semimetal, such as Bi, may also be used.

In the present embodiment, an excited electron absorption layer is disposed in one of the electrodes. Thereby, the magnitude of signals generated by radiation absorbed by that electrode can be significantly reduced. It is thus possible to realize a state in which substantially only signals generated by radiation absorbed by the other electrode are generated from the device. As a result, the magnitude of the signal is determined definitely by the energy of radiation so that measurement of energy distribution of radiation is thus facilitated.

A fourth embodiment of the present invention will be described by referring to FIGS. 14 to 16. According to the fourth embodiment, a normal conducting metal layer having no energy gap or a superconductor layer is disposed between a superconducting tunnel junction having a lower electrode / tunnel barrier / upper electrode and a substrate in order to absorb phonons and use energy of the phonons as energy for exciting electrons. Thereby, the phonon signals generated by radiation absorbed in the substrate are suppressed.

In the past, there was a Josephson circuit device having a ground plane as a superconducting device close resembling in structure the radiation detecting device of the present invention. However, the ground plane is entirely different from the phonon absorption layer in purpose, function and action. In the circuit device, the width of a strip line and the distance between the strip line and the ground plane must be designed with considerably high precision in order to control the inductance of the strip line. In addition, the junction itself and the structure of wiring can be clearly distinguished from the detecting device. Furthermore, whether the junction is being used as the circuit device or used as the detecting device can also be distinctly distinguished on the basis of configuration that it has as the circuit or detector. In addition, such a Josephson circuit device has never been used as a detecting device.

By adopting a structure having a substrate, a normal conducting metal or a superconductor; an insulator, or a semiconductor; and a superconducting tunnel junction, in sequence, from the bottom, energy of phonons having large energy generated by radiation absorbed in the substrate is used to excite electrons of a phonon absorption layer made of a normal conducting metal or a superconductor having a small energy gap.

Electrons excited by phonons in the phonon absorption layer emit a large number of phonons and lose energy. Energy of phonons mainly emitted at that time is close to the gap energy of the phonon absorption layer. Phonons having energy larger than the gap energy of the absorption layer have a high probability of exciting electrons again in the phonon absorption layer and, thereby, losing energy. For example, in case the superconductor of the phonon absorption layer is the same as the superconductor of the junction, phonons having energy nearly equal to the gap energy of the superconductor when emerged from the phonon absorption layer cannot excite electrons above the energy gap even when they reach the junction, if the phonons are scattered in the insulation layer and lose any energy before they reach the junction. Phonons that escape from a phonon absorption layer having an energy gap smaller than that of the superconductor of the junction and impinge upon the junction cannot excite electrons within the junction and do not generate false signals.

Making the phonon absorption layer thinner increases the probability that phonons that are generated in the substrate and arrive at the phonon absorption layer will pass through the phonon absorption layer without providing electrons included in the phonon absorption layer with energy. The thickness of the phonon absorption layer is preferably at least 20 nm. If the phonon absorption layer is thin, the probability that phonons having large energy emitted from excited electrons in the phonon absorption layer get out of the phonon absorption layer also becomes higher. More preferably, therefore, the phonon absorption layer has a thickness of at least 100 nm.

How deep X rays can penetrate into the substrate largely depends upon energy of the radiation. If the thickness of the insulation layer is larger than the depth, there is no substantial effect in providing a phonon absorption layer. If, on the contrary, the thickness of the insulation layer is sufficiently thinner, such as 20 μm or less, for example, than a thickness, such as 100 μm, for example, allowing X rays to penetrate therein, providing the phonon absorption layer is considered to have a sufficient effect.

Some phonons are generated by radiation that is absorbed in an insulation layer made of an insulator or a semiconductor having a low electric conductivity between the junction and the phonon absorption layer. For phonons that do not proceed to the phonon absorption layer but proceed to the junction, the phonon absorption layer is not helpful. For reducing the phonon signals, therefore, the insulation layer is desired to be thin. For making the number of phonon signals less than the number of true signals generated directly from the junction, the thickness of the insulation layer is desired to be 2 μm or less. If the insulation layer is made too thin, however, there occurs a problem that the phonon absorption layer is electrically coupled to the junction by an insulation defect of the insulation layer. Hence, performance of the junction functioning as the radiation detector is deteriorated. Furthermore, if the insulation layer is thin, there also occurs a problem that the electrostatic capacity of the device becomes large although the insulation is sufficient, because the electrostatic capacity between the junction and the phonon absorption layer becomes large. The thickness of the insulation layer is desired to be sufficiently thick, preferably at least 20 nm, as compared with the thickness approximately 2 nm, of the tunnel barrier of the junction so that the electrostatic capacity between the junction and the phonon absorption layer becomes sufficiently smaller than that of the junction itself.

Furthermore, for suppressing an increase of electrostatic capacity caused by electrostatic capacity coupling among the junction, phonon absorption layer, and the electric ground, the insulation layer is desired to be sufficiently thick. In addition, the area of the phonon absorption layer is desired to be small in order to make electrostatic capacity between the phonon absorption-layer and electric ground (located under the substrate) small. Therefore, the area of the phonon absorption layer is desired to be one hundred times or less that of the junction.

It is well known that most semiconductors allow almost no current to flow therethrough at a very low temperature at which a superconducting tunnel junction is used. As a matter of course, therefore, such a semiconductor may be used as the material of the insulation layer.

Three examples 4A, 4B and 4C of a radiation detecting device according to the fourth embodiment will now be described.

In all embodiments, a substrate having a junction fabricated thereon is cut into chips of 5×5 mm$^2$. Junctions were evaluated on the chips. Detecting devices were cooled to approximately 0.4 K and measurement was performed. While applying a magnetic field to the detecting device in parallel to the junction face to suppress the DC Josephson current and applying X rays from $^{55}$Fe to the detecting device, signals were measured.

(Example 4A)

Figure 14:
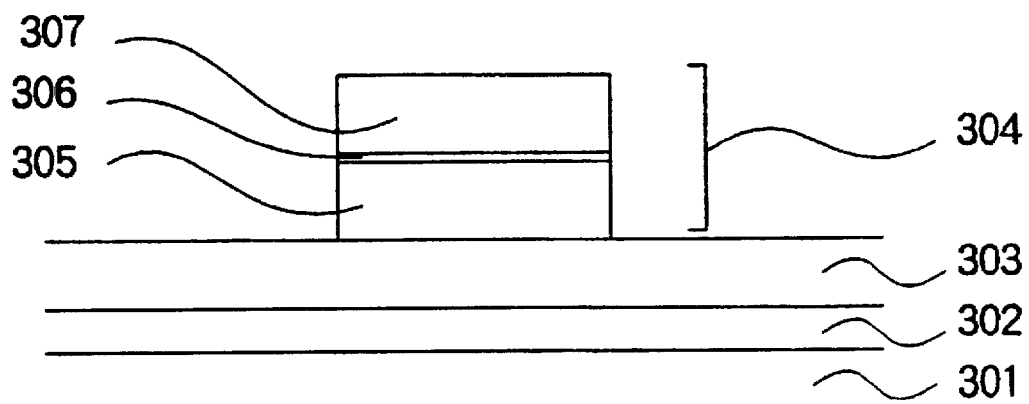
FIG. 14 is a sectional view showing the structure of a fourth embodiment of a radiation detecting device according to the present invention.

As shown in FIG. 14, a monocrystalline film 302 of tantalum (Ta) having a thickness of approximately 100 nm was formed on a sapphire substrate 301. An insulation film 303 of silicon oxide (SiO) having a thickness of 100 nm was formed on the monocrystalline film. A Nb/Al-AlOx/Nb superconducting tunnel junction 304 having Nb as a principal superconductor and having an area of 100×100 μm² was fabricated on the insulation film. Each of Nb layers 305 and 307 of the junction has a thickness of 200 nm. The Al-AlOx layer 306 has a thickness of approximately 12 nm. Therefore, the superconducting energy gap of the Al layer in this case is slightly smaller than and nearly equal to the energy gap of Nb because of the proximity effect with respect to thick Nb. Energy gaps of Ta and Nb are 1.4 meV and 3.0 meV, respectively.

The number of phonon signals reduced to approximately one-tenth of that of the conventional device.

(Example 4B)

A device identical to the device of example 4A except that the thickness of the silicon oxide film 303 was 300 nm was fabricated.

As compared with the conventional device, phonon signals are reduced significantly. However, the number of phonon signals are increased to approximately three times that of example 4A.

(Example 4C)

A device identical to the device of example 4A except that the thickness of the tantalum film was 20 nm was fabricated.

The number of phonon signals increased to approximately four times that of example 4A.

(Example 4D)

A device identical to the device of the example 4A except that the surface of the tantalum film 302 was subjected to anodic oxidation by approximately 20 nm and a SiO film 303 having a thickness of 20 nm was formed on the tantalum film.

Noise increased by approximately 50% as compared with example 4A.

(Example 4E)

Figure 15:
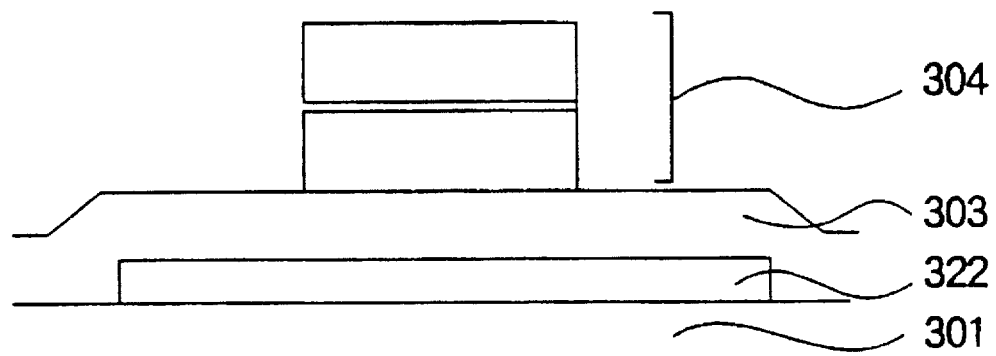
FIG. 15 is a sectional view showing an example of a variant of the fourth embodiment of a radiation detecting device according to the present invention.

As shown in FIG. 15, a tantalum film 322 was processed to take the shape of an island of 500×500 μm². Thereon, a SiO film 303 having a thickness of 200 nm was formed. Further thereon, a junction 304 was fabricated so as to be positioned on the center of the island-shaped tantalum film 322. Other conditions of fabrication are the same as those of example 4A.

In this case, noise decreased by approximately 10% as compared with example 4A.

(Example 4F)

Figure 16:
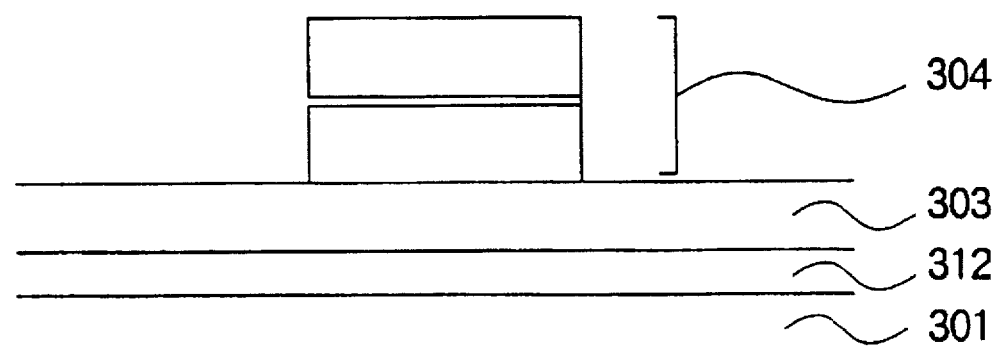
FIG. 16 is a sectional view showing another example of a variant of the fourth embodiment of a radiation detecting device according to the present invention.

As shown in FIG. 16, a film 312 of gold, which is normally a conducting metal, having a thickness of approximately 300 nm was formed on a silicon (Si) substrate 301. Thereon, a SiO₂ film 303 having a thickness of approximately 200 nm was formed. Additionally, an Al/AlOx/Al superconducting tunnel junction having an area of 100×100 μm² was fabricated on the SiO₂ film. Each of the Al layers has a thickness of 150 nm. The energy gap of Al is 0.34 meV.

Phonon signals reduced to one-tenth or less of those of the conventional Al junction.

(Example 4G)

On a silicon substrate 301, an aluminum film 312 having a thickness of approximately 200 nm was formed. The surface thereof was oxidized by approximately 3 nm. On the oxidized surface, an aluminum oxide film 303 having a thickness of 100 nm was further formed. On that substrate, a Ta/Al-AlOx/Ta superconducting tunnel junction 304 was fabricated.

In this case, phonon signals reduced to one-tenth or less of those of the conventional Ta junction.

(Example 4H)

As the phonon absorption layer, a polycrystalline Nb film was formed and used. Other conditions of fabrication are the same as those of the device of example 4A.

In this case, phonon signals are reduced to one fourth or less of those of the conventional Nb junction.

It is well known that in many thin film superconductors purity of a film changes according to the degree of vacuum when the film is formed. Superconducting transition temperature and the magnitude of the energy gap are thereby changed. If this fact is used, it is a matter of course that even a superconductor having an intrinsic energy gap larger than that of the superconductor of the junction can be used as an efficient material of the phonon absorption layer.

According to the present embodiment, it is possible to prevent high-energy phonons generated by radiation absorbed in the substrate from impinging upon the superconducting tunnel junction and generating false signals.

We claim:

1. A radiation detecting device comprising:
a superconducting tunnel junction having a three-layer structure formed by depositing a lower electrode, a tunnel barrier layer, and an upper electrode in sequence, said upper electrode, said tunnel barrier layer, and said lower electrode having substantially aligned side walls around substantially their entire perimeters such that a cross-section of said three-layer structure along a plane perpendicular to a direction of said deposition being substantially constant in shape and size along the direction of said deposition and such that no portion of said lower electrode or said upper electrode extends beyond said tunnel barrier layer, wherein at least one of said upper and lower electrode is made of a superconducting material.

2. A radiation detecting device according to claim 1, further comprising lower wiring connected to said lower electrode of said tunnel junction, wherein said lower electrode is made of a superconducting material and said lower wiring includes a layer of the same superconducting material as said lower electrode.

3. A radiation detecting device according to claim 1, further comprising lower wiring connected to said lower electrode, said lower wiring having a thickness smaller than a thickness of said lower electrode.

4. A radiation detecting device according to claim 3, wherein said lower wiring overlaps at a first end with said lower electrode.

5. A radiation detecting device according to claim 4, wherein said lower wiring comprises a layer of a conductive material and an etching stopper film covering a topside of said layer of the conductive material, said etching stopper film being made of a material that resists etching used to form said tunnel junction.

6. A radiation detecting device according to claim 5, wherein said lower electrode is made of a super conducting material and wherein the conductive material of said lower wiring is a superconducting material having an energy gap larger than an energy gap of the superconducting material of said lower electrode.

7. A radiation detecting device according to claim 4, wherein said lower wiring comprises a first layer of a conductive material and overlaps at its first portion said lower electrode and a second layer covering only a second portion of said first layer other than said first portion that overlaps said lower electrode and disposed outside of said tunnel junction, said second layer being made of a normal metal or a superconducting material having an energy gap smaller than that of the superconducting material of said lower electrode.

8. A radiation detecting device comprising:

a substrate;

a superconducting tunnel junction having a three-layer structure formed by depositing, on said substrate in sequence, an upper electrode, a tunnel barrier layer, and a lower electrode, wherein at least one of said upper electrode and said lower electrode is made of a superconducting material; and an excited electron absorption layer made of one of a superconducting material having an energy gap smaller than that of the superconducting material forming at least one of said upper electrode and said lower electrode, a normal conducting metal having no energy gap, and a semimetal, the excited electron absorption layer being formed in a position disposed within one of said upper electrode and said lower electrode and isolated from said tunnel barrier layer.

9. A radiation detecting device comprising:

a substrate;

a superconducting tunnel junction having a three-layer structure formed by depositing, on said substrate in sequence, a lower electrode, a tunnel barrier layer, and an upper electrode, at least one of said electrode and said lower electrode is made of a superconducting material;

a phonon absorption layer made of either a superconducting material having an energy gap smaller than that of the superconducting material forming at least one of said upper electrode and said lower electrode, or a normal conducting metal having no energy gap, said phonon absorption layer being formed between said substrate and said junction and having a thickness of at least 20 nm; and an insulating layer formed between formed between said phonon absorption layer and said junction and having a thickness greater than 20 nm and less than 20 μm.

10. A radiation detecting device according to claim 9, further comprising an insulation layer between said substrate and said junction, wherein said phonon absorption layer is formed in said insulation layer so as to take the shape of an island.

11. A radiation detecting device including a superconducting tunnel junction, comprising:

a lower electrode layer;

an upper electrode layer; and a tunnel barrier layer between and in contact with said upper electrode layer and said lower electrode layer;

wherein said lower electrode layer, said upper electrode layer, and said tunnel barrier layer having substantially similar cross-sectional areas in plane parallel to said lower electrode layer, said upper electrode layer, and said tunnel barrier layer such that no portion of said lower electrode or said upper electrode extends beyond said tunnel barrier layer; and wherein at least one of said lower electrode layer and said upper electrode layer is made of a superconducting material.

* * * * *